(12) United States Patent
Zhang et al.

(10) Patent No.: US 10,811,475 B2
(45) Date of Patent: Oct. 20, 2020

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Can Zhang, Beijing (CN); Jie Fu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 96 days.

(21) Appl. No.: 15/743,465

(22) PCT Filed: Jun. 13, 2017

(86) PCT No.: PCT/CN2017/088078
§ 371 (c)(1),
(2) Date: Jan. 10, 2018

(87) PCT Pub. No.: WO2018/086347
PCT Pub. Date: May 17, 2018

(65) Prior Publication Data
US 2019/0267436 A1 Aug. 29, 2019

(30) Foreign Application Priority Data
Nov. 11, 2016 (CN) .......................... 2016 1 0994873

(51) Int. Cl.
*H01L 27/32* (2006.01)
*H01L 51/00* (2006.01)
(Continued)

(52) U.S. Cl.
CPC ...... *H01L 27/3246* (2013.01); *H01L 27/1214* (2013.01); *H01L 27/1259* (2013.01);
(Continued)

(58) Field of Classification Search
None
See application file for complete search history.

(56) References Cited

U.S. PATENT DOCUMENTS 7,808,177 B2 * 10/2010 Ha .................... H01L 27/3209
313/504
8,497,822 B2 * 7/2013 Ohtani ............... H01L 27/3209
345/76
(Continued)

FOREIGN PATENT DOCUMENTS

CN 1615059 A 5/2005
CN 1638570 A 7/2005
(Continued)

OTHER PUBLICATIONS

First Chinese Office Action dated Nov. 7, 2018.
Search Report and Written Opinion dated Sep. 19, 2017 from State Intellectual Property Office of the P.R. China.

*Primary Examiner* — Dung A. Le
(74) *Attorney, Agent, or Firm* — Dilworth & Barrese, LLP.; Michael J. Musella, Esq.

(57) ABSTRACT

An array substrate and a manufacturing method thereof, and a display device are provided. The array substrate includes a substrate, and a plurality of pixel units arranged in an array on the substrate, each of the pixel units is provided with a plurality of thin film transistors, each of the pixel units includes a plurality of light emitting units, the plurality of light emitting units are sequentially arranged along a direction perpendicular to a plane where the substrate is located, and disposed at a side of the thin film transistors away from the substrate, each of the light emitting units is connected with one of the thin film transistors, and different ones of the light emitting units are connected to different ones of the thin film transistors.

17 Claims, 3 Drawing Sheets

(51) Int. Cl.
*H01L 51/56* (2006.01)
*H01L 27/12* (2006.01)
*H01L 51/52* (2006.01)
*C23C 14/04* (2006.01)

(52) U.S. Cl.
CPC ...... *H01L 27/3211* (2013.01); *H01L 27/3262* (2013.01); *H01L 51/001* (2013.01); *H01L 51/0011* (2013.01); *H01L 51/0017* (2013.01); *H01L 51/5278* (2013.01); *H01L 51/56* (2013.01); *C23C 14/042* (2013.01); *H01L 2227/323* (2013.01)

(56) References Cited

U.S. PATENT DOCUMENTS

| | | | |
|---|---|---|---|
| 2003/0043316 A1 | 3/2003 | Matsumoto et al. | |
| 2003/0218173 A1* | 11/2003 | Nishi | H01L 27/3209 257/79 |
| 2005/0062408 A1* | 3/2005 | Yoo | H01L 27/3209 313/504 |
| 2005/0140275 A1 | 6/2005 | Park | |
| 2005/0242712 A1 | 11/2005 | Sung | |
| 2005/0264550 A1 | 12/2005 | Ohshima et al. | |
| 2006/0255725 A1* | 11/2006 | Kim | H01L 27/3209 313/506 |
| 2009/0261354 A1* | 10/2009 | Ha | H01L 51/5052 257/87 |
| 2011/0121738 A1 | 5/2011 | Kawano et al. | |
| 2015/0102324 A1* | 4/2015 | Lee | H01L 27/3244 257/40 |
| 2016/0233277 A1 | 8/2016 | Chae et al. | |
| 2016/0293083 A1 | 10/2016 | Yang et al. | |

FOREIGN PATENT DOCUMENTS

| | | |
|---|---|---|
| CN | 1702725 A | 11/2005 |
| CN | 104269429 A | 1/2015 |
| CN | 205121533 U | 3/2016 |
| CN | 106449659 A | 2/2017 |
| JP | 2007057667 | 3/2007 |
| JP | 2010020154 A | 1/2010 |
| KR | 1020080061766 A | 7/2008 |
| KR | 1020140140861 A | 12/2014 |
| WO | 2010016446 A | 2/2010 |

* cited by examiner

ARRAY SUBSTRATE, MANUFACTURING METHOD THEREOF AND DISPLAY DEVICE

TECHNICAL FIELD

Embodiments of the present disclosure relate to an array substrate and a manufacturing method thereof, and a display device.

BACKGROUND

A silicon-based active matrix organic light emitting diode (AMOLED) micro display device has broad market application prospects, and is particularly applicable for a helmet mounted display device, a stereo display glass, a glasses type display device, and so on. If a micro display device is combined with systems such as a mobile communication network and a satellite positioning system, the micro display device can acquire precise image information from anywhere at anytime. A silicon-based AMOLED micro display device can provide video display with high definition for a mobile information product such as a portable computer, a wireless internet explorer, a portable DVD, a game platform and a wearable computer. Thus, the silicon-based AMOLED micro display device provides an excellent near eye application (for example, helmet display) path to the civil consumption field, industrial applications and even military applications.

SUMMARY

At least one embodiment of the present disclosure provides an array substrate and a manufacturing method thereof, and a display device. The array substrate can be adopted to not only achieve an effect of realizing full color without a color filter and being switchable between a monochrome display device and a full color display device, but also improve the PPI (Pixel Per Inch).

At least one embodiment of the present disclosure provides an array substrate, which includes a substrate, and a plurality of pixel units arranged in an array on the substrate, each of the pixel units is provided with a plurality of thin film transistors, each of the pixel units includes a plurality of light emitting units, the plurality of light emitting units are sequentially arranged along a direction perpendicular to a plane where the substrate is located, and disposed at a side of the thin film transistors away from the substrate, each of the light emitting units is connected with one of the thin film transistors, and different ones of the light emitting units are connected to different ones of the thin film transistors.

For example, in the array substrate provided by an example of the present embodiment, the array substrate further includes a barrier wall, surrounding each of the pixel units to define a region for forming the light emitting units.

For example, in the array substrate provided by an example of the present embodiment, a thickness of the barrier wall gradually decreases along a direction from a position close to the substrate to a position away from the substrate.

For example, in the array substrate provided by an example of the present embodiment, at least one of the thin film transistors is formed between the barrier wall and the substrate, and at least one of the light emitting units is connected with a corresponding one of the thin film transistors through a via hole disposed in the barrier wall.

For example, in the array substrate provided by an example of the present embodiment, the array substrate further includes: a thin film packaging layer, disposed at a side of each of the light emitting units away from the substrate.

For example, in the array substrate provided by an example of the present embodiment, each of the light emitting units includes a first electrode, a light emitting layer and a second electrode, and the first electrode is connected with a corresponding one of the thin film transistors.

For example, in the array substrate provided by an example of the present embodiment, the plurality of light emitting units respectively emit light with different colors.

For example, in the array substrate provided by an example of the present embodiment, each of the pixel units includes three thin film transistors and three light emitting units, and the three light emitting units respectively emit red light, green light, and blue light.

For example, in the array substrate provided by an example of the present embodiment, a maximum size of each of the plurality of light emitting units along a direction parallel to the plane where the substrate is located is less than 10 μm.

At least one embodiment of the present disclosure provides a manufacturing method of an array substrate which includes: forming a plurality of pixel units arranged in an array on a substrate; forming each of the pixel units includes: forming a plurality of thin film transistors on the substrate; and forming a plurality of light emitting units on the plurality of thin film transistors, the plurality of light emitting units are sequentially arranged along a direction perpendicular to a plane where the substrate is located, wherein each of the light emitting units is connected with one of the thin film transistors, and different ones of the light emitting units are connected to different ones of the thin film transistors.

For example, in the manufacturing method of the array substrate provided by an example of the present embodiment, the manufacturing method further includes: after forming the plurality of thin film transistors, forming a barrier wall to define a region for forming the light emitting units, forming the plurality of light emitting units on the plurality of thin film transistors includes: forming at least one layer in at least one of the light emitting units by an evaporation method using the barrier wall as an evaporation mask plate.

For example, in the manufacturing method of the array substrate provided by an example of the present embodiment, one of the light emitting units closest to the thin film transistors is formed through an etching method.

For example, in the manufacturing method of the array substrate provided by an example of the present embodiment, at least one of the thin film transistors is formed between the barrier wall and the substrate, and the manufacturing method further includes: forming a via hole in the barrier wall, and connecting at least one of the light emitting units with a corresponding one of the thin film transistors through the via hole.

For example, in the manufacturing method of the array substrate provided by an example of the present embodiment, the manufacturing method further includes: forming a thin film packaging layer at a side of each of the light emitting units away from the substrate.

At least one embodiment of the present disclosure provides a display device, which includes any one of the abovementioned array substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 1b is a sectional view taken along AB direction of a pixel unit illustrated by FIG. 1a;

Reference numerals: 10—substrate; 100—pixel unit; 110—first light emitting unit; 111—first electrode of first light emitting unit; 112—light emitting layer of first light emitting unit; 113—second electrode of first light emitting unit; 121—first electrode of second light emitting unit; 122—light emitting layer of second light emitting unit; 123—second electrode of second light emitting unit; 130—third light emitting units; 131—first electrode of third light emitting unit; 132—light emitting layer of third light emitting unit; 133—second electrode of third light emitting unit; 140—first thin film transistor; 150—second thin film transistor; 160—third thin film transistor; 200—barrier wall; 201—first via hole; 202—second via hole; 310—first thin film packaging layer; 320—second thin film packaging layer; 330—third thin film packaging layer.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to indicate any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A colorizing method of a silicon-based active matrix organic light emitting diode (AMOLED) adopts a method of combining a white light organic light emitting diode (WOLED) and a color filter (CF); however, the transmittance of a color filter is relatively low, about 30-40%, which results in the loss of most of luminous efficiency and the increase of power consumption. Generally, the PPI (Pixel Per Inch) obtained through a method of using a high-precision FMM (Fine Metal Mask) technology to directly evaporate red, green, and blue pixel units is not high enough, and the method cannot be applied to the preparation of a micro organic light emitting diode (micro-OLED); because the size of pixels of the micro organic light emitting diode display is relatively small, generally several micrometers, the high-precision FMM technology cannot satisfy the accuracy requirement of the micro organic light emitting diode display.

At least one embodiment of the present disclosure provides an array substrate, which includes a substrate and a plurality of pixel units arranged on the substrate in an array. Each of the pixel units is provided with a plurality of thin film transistors, each of the pixel units includes a plurality of light emitting units, the plurality of light emitting units are sequentially arranged along a direction perpendicular to a plane where the substrate is located, and disposed at a side of the thin film transistors away from the substrate; besides, the plurality of light emitting units and the plurality of thin film transistors are connected in one-to-one correspondence. That is to say, each of the light emitting units is connected with one of the thin film transistors, and different ones of the light emitting units are connected to different ones of the thin film transistors. The array substrate can be adopted to not only achieve an effect of realizing full color without a color filter and being switchable between a monochrome display device and a full color display device, but also improve the PPI (Pixel Per Inch).

At least one embodiment of the present disclosure provides a manufacturing method of an array substrate which includes: forming a plurality of pixel units arranged in an array on a substrate. Forming each of the pixel units includes: forming a plurality of thin film transistors on the substrate; forming a plurality of light emitting units on the plurality of thin film transistors, the plurality of light emitting units are sequentially arranged along a direction perpendicular to a plane where the substrate is located; besides, each of the light emitting units is connected with one of the thin film transistors, and different ones of the light emitting units are connected to different ones of the thin film transistors. The manufacturing method of the array substrate can be adopted to not only achieve an effect of realizing full color without a color filter and being switchable between a monochrome display device and a full color display device, but also improve the PPI (Pixel Per Inch).

At least one embodiment of the present disclosure provides a display device, which includes any one of the abovementioned array substrate, which can be switchable between a monochrome display device and a full color display device, and improve the PPI (Pixel Per Inch).

Hereafter, several embodiments are described in the following.

First Embodiment

Figure 1A:
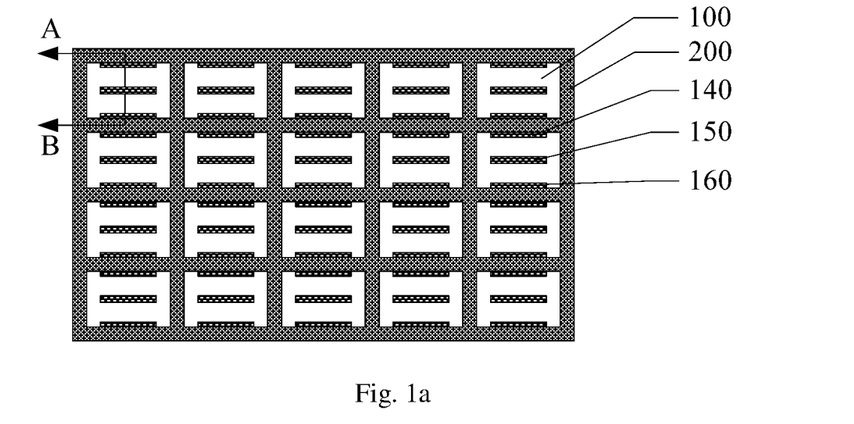
FIG. 1a is a schematic diagram of an array substrate provided by an embodiment of the present disclosure.

At least one embodiment of the present disclosure provides an array substrate. As illustrated by FIG. 1a, the array substrate includes a substrate 10 and a plurality of pixel units 100 arranged in an array on the substrate 10. Each of the pixel units 100 is provided with a plurality of thin film transistors 140, 150 and 160. For example, a plurality of thin film transistors 140, 150, and 160 can be arranged in parallel on the substrate 10; however, the present embodiment is not limited thereto, the thin film transistors can be arranged in other arrangement method. FIG. 1a is an exemplary schematic diagram of the distribution and number of the thin film transistors, in the FIG. 1a, three thin film transistors 140, 150, and 160 are illustrated in each of the pixel units 100. However, the embodiments of the present disclosure are not limited thereto, for example, the number of the thin film transistors may be two, four, or more.

Figure 1B:
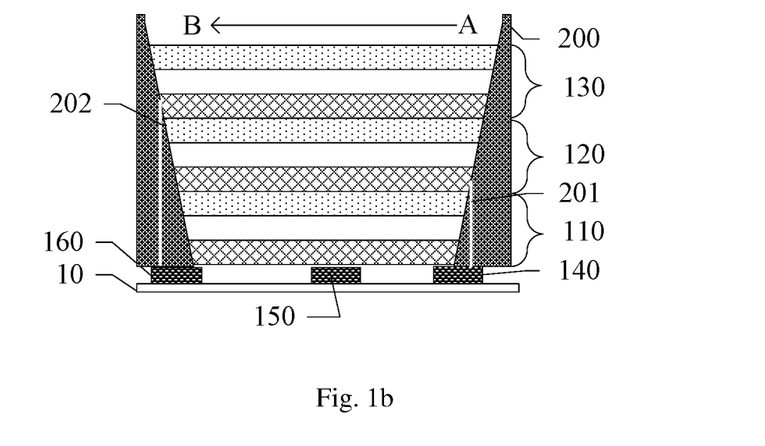

FIG. 1b is a sectional view taken along AB direction of a pixel unit 100 in FIG. 1a. As illustrated by FIG. 1b, each of the pixel units 100 includes a plurality of light emitting units 110, 120, and 130, the plurality of light emitting units 110, 120, and 130 are arranged along a direction perpendicular to a plane where the substrate 10 is located, and disposed at a side of the plurality of thin film transistors 140, 150, and 160 away from the substrate 10, i.e., the plurality of light emitting units 110, 120, and 130 are sequentially stacked, as illustrated by FIG. 1b. Besides, each of the light emitting units is connected with one of the thin film transistors 140, 150, and 160, and different ones of the light emitting units are connected to different ones of the thin film transistors. It is to be noted that, the number of the thin film transistors and the number of the light emitting units are the same, each of the thin film transistors is configured to independently control a light emitting unit to emit light or not emit light, so as to achieve an effect of realizing full color without a color filter and being switchable between a monochrome display device and a full color display device.

For example, as illustrated by FIG. 1a and FIG. 1b, the array substrate further includes a barrier wall 200, surrounding each of the pixel units 100 to define a region for forming the light emitting units 110, 120, and 130, that is to say, adjacent ones of the pixel units 100 are separated by the barrier wall 200. It is to be noted that, FIG. 1a is a schematic diagram showing that the pixel units 100 has a shape of a rectangle, the present embodiment is not limited thereto, and the shape of the pixel units 100 can be a circular shape or a polygon shape.

For example, as illustrated by FIG. 1b, a shape and size of a pattern of at least one of the light emitting units 110, 120, and 130 in the pixel unit 100 is the same as the shape and size of the region defined by the barrier wall 200, i.e., the barrier wall 200 closely contacts at least one of the light emitting units 110, 120, and 130 to define the shape and size of the light emitting unit. For example, the barrier wall 200 can surround the second light emitting unit 120 and the third light emitting unit 130 to define the shape and size of the second light emitting unit 120 and the third light emitting unit 130, and the present disclosure is not limited thereto. It is to be noted that, the barrier wall 200 can pattern the shape and size of all of the light emitting units, or pattern the shape and size of the light emitting units except the light emitting unit closest to the thin film transistors.

For example, the barrier wall 200 can serve as a mask plate to pattern at least one of the light emitting units. For example, the barrier wall 200 serves as a mask plate to evaporate at least one layer in at least one of the light emitting units. Therefore, a high-precision FMM and a color filter which are required to manufacture an organic light emitting diode can be saved by using the barrier wall 200 as a mask plate, and the PPI of the organic light emitting diode display device can be improved.

For example, the barrier wall 200 can serve as a mask plate to pattern a light emitting unit of a micro organic light emitting diode. For example, the size of each of the light emitting units (a maximum size along a direction parallel to the substrate) is less than 10 μm. For example, the size of each of the light emitting units is in a range of 2 μm to 4 μm.

For example, the barrier wall 200 can serve as a mask plate to pattern a light emitting unit with a size which is larger than 10 μm of the organic light emitting diode display device.

During a common packaging process, a vacuuming process is required to guarantee a pressing state of a cover plate glass; however, the pixels are easy to be damaged during the vacuuming process. In the present embodiment, as illustrated by FIG. 1b, a height of the barrier wall 200 along a direction perpendicular to the plane where the substrate 10 is located can be larger than a height of an entity of the plurality of light emitting units 110, 120, and 130, for example, the height of the barrier wall 200 is larger than 3 μm to 6 μm. The present embodiment is not limited thereto, the height of the barrier wall 200 along a direction perpendicular to the plane where the substrate 10 is located can be equal to the height of the entity of the plurality of light emitting units 110, 120, and 130. In a case where the height of the barrier wall 200 is larger than or equal to the height of an entity of the plurality of light emitting units 110, 120, and 130, the pressure on the pixel units 100 during the vacuuming process can be reduced, so as to reduce probability of damaging the pixels.

For example, in a direction from a position close to the substrate 10 to a position away from the substrate 10, the thickness of the barrier wall 200 gradually decreases. Herein, the thickness of the barrier wall 200 refers to a width of a cross-section of the barrier wall 200. As illustrated by FIG. 1b, the cross-section of the barrier wall 200 taken along the AB direction has a trapezoid shape, and the present embodiment is not limited thereto, the cross-section can also has a triangle or stair shape. For example, in a pixel unit region surrounded by the barrier wall 200, the sizes of the plurality of light emitting units 110, 120, and 130 along a direction from the position close to the substrate 10 to the position away from the substrate 10 are not completely the same, for example, successively increasing. For example, the size of the third light emitting unit 130 is larger than that of the second light emitting unit 120, and the size of the second light emitting unit 120 is larger than that of the first light emitting unit 110.

For example, at least one of the thin film transistors 140, 150, and 160 is formed between the barrier wall 200 and the substrate 10, and at least one of the light emitting units 110, 120, and 130 is connected with a corresponding one of the thin film transistors through via holes 201 and 202 disposed in the barrier wall 200. As illustrated by FIG. 1b, the barrier wall 200 includes a first via hole 201 and a second via hole 202. A first thin film transistor 140 is electrically connected with the second light emitting unit 120 through the first via hole 201, a third thin film transistor 160 is electrically connected with the third light emitting unit 130 through the second via hole 202. For example, the first via hole 201 and the second via hole 202 can be formed through a method of using laser to puncture the barrier wall 200, the present embodiment is not limited thereto, and the via holes can be formed through an etching method or the like.

For example, a material of the barrier wall 200 can be photoresist or other organic material, and the present embodiment is not limited thereto.

Figure 2:
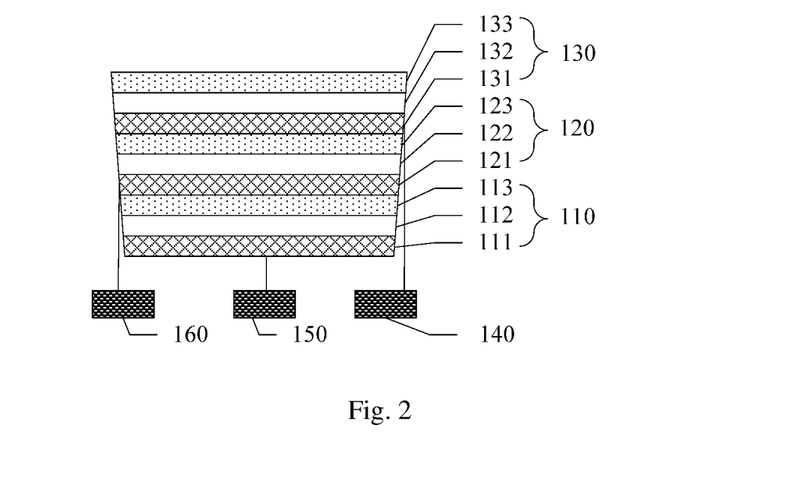
FIG. 2 is a schematic diagram of a pixel unit provided by an embodiment of the present disclosure.

FIG. 2 is a schematic diagram of a pixel unit provided by an embodiment of the present disclosure. As illustrated by FIG. 2, each of the pixel units 100 includes three thin film transistors 140, 150, and 160 which are arranged in parallel on the substrate, and three light emitting units 110, 120, and 130 sequentially disposed along a direction perpendicular to the plane where the substrate 10 is located at a side of the thin film transistors 140, 150, and 160 away from the substrate 10; and each of the light emitting units is connected with one of the thin film transistors 140, 150, and 160, and different ones of the light emitting units are connected to different ones of the thin film transistors. For example, the first thin film transistor 140 is electrically connected with the third light emitting unit 130, the second thin film transistor 150 is electrically connected with the first light emitting unit 110, and the third thin film transistor 160 is electrically connected with the second light emitting unit 120. The present embodiment is not limited thereto, the first thin film transistor 140 can also be electrically connected with the second light emitting unit 120, the second thin film transistor 150 can also be electrically connected with the first light emitting unit 110, and the third thin film transistor 160 can also be electrically connected with the third light emitting unit 130, so as to realize that each of the thin film transistors independently controls a light emitting unit. It is to be noted that a connect line independently connecting each of the thin film transistors and the corresponding light emitting unit in FIG. 2 is an exemplary schematic diagram of an electrical connection relationship; in practice, the electrical connection is realized by evaporating a first electrode material through a via hole, so as to connecting the first electrode of the light emitting unit with a drain electrode of the thin film transistor. By means of using different ones of the thin film transistors to independently control different ones of the light emitting units, an effect of a full color display device or a monochrome display device can be realized, and the PPI can also be improved.

For example, the plurality of light emitting units 110, 120, and 130 respectively emit light with different colors. For example, the first light emitting unit 110, the second light emitting unit 120 and the third light emitting unit 130 can respectively be a red light emitting unit, a green light emitting unit, and a blue light emitting unit, and the present embodiment is not limited thereto. For example, the decay lifetimes of different light emitting units are different, the green light emitting unit generally has a longer decay lifetime than the red and blue light emitting units, according to the practical application situation, the thin film transistors 140, 150, and 160 in each of the pixel units 100 can be respectively controlled to make the green light emitting unit 120 independently emit light, and the light emitting units with the other colors do not emit light, so as to obtain a green monochrome display device.

For example, an organic light emitting diode display device of different colors can be obtained by respectively controlling at least one of the light emitting units 110, 120, and 130 to emit light through controlling the thin film transistors 140, 150, and 160 in each of the pixel units 100.

For example, in three pixel units 100 along a same direction, the thin film transistors 140, 150, and 160 in each of the pixel units 100 respectively control one of the three different light emitting units 110, 120, and 130 to emit light, for example, the thin film transistors 140, 150, and 160 in the three pixel units 100 respectively control the third light emitting unit 130 in the first pixel unit to emit light, the first light emitting unit 110 in the second pixel unit to emit light, and the second light emitting unit 120 in the third pixel unit to emit light, so as to realize a full color display device, and the present embodiment is not limited thereto.

For example, a full color display device can be obtained by controlling all of the light emitting units 110, 120, and 130 to emit light through the thin film transistors 140, 150, and 160 in the pixel unit 100; besides, compared with an ordinary full color display device, the full color display device in the present disclosure has higher PPI, i.e., a display effect of high resolution same with the size of the physical pixels can be obtained.

For example, each of the light emitting units includes a first electrode, a light emitting layer and a second electrode. As illustrated by FIG. 2, the first light emitting unit 110 includes a first electrode 111, a light emitting layer 112, and a second electrode 113; the second light emitting unit 120 includes a first electrode 121, a light emitting layer 122, and a second electrode 123; the third light emitting unit 130 includes a first electrode 131, a light emitting layer 132, and a second electrode 133. For example, the first electrode 111 of the first light emitting unit 110, the first electrode 121 of the second light emitting unit 120, and the first electrode 131 of the third light emitting unit 130 are anodes, the second electrode 113 of the first light emitting unit 110, the second electrode 123 of the second light emitting unit 120, and the second electrode 133 of the third light emitting unit 130 are cathodes, the present embodiment is not limited thereto. It is to be noted that, the anode of each of the light emitting units is individually connected with the corresponding thin film transistor, and the corresponding thin film transistor respectively controls each of the light emitting units to emit light or not to emit light.

For example, a material of the first electrode and the second electrode is a conductive material. Specifically, except the first electrode 111 of the first light emitting unit 110, the other first electrodes and second electrodes need to be made of a transparent conductive material, so that the light emitted from the light emitting units can exit well. It is to be noted that, the material of the first electrode 111 of the first light emitting unit 110 can be a transparent conductive material, or a non-transparent conductive material. For example, the material of the first electrode and the second electrode can include a metal oxide material or a metal material. For example, the metal oxide material includes indium tin oxide, indium-doped zinc oxide, and so on. For example, the thickness of the metal oxide material is 300-500 nm, the present embodiment is not limited thereto. For example, the metal material includes silver, aluminum and so on. For example, the thickness of the metal material is 10-20 nm, and the present embodiment is not limited thereto, as long as the thickness is thin enough to make the metal material transparent.

Figure 3:
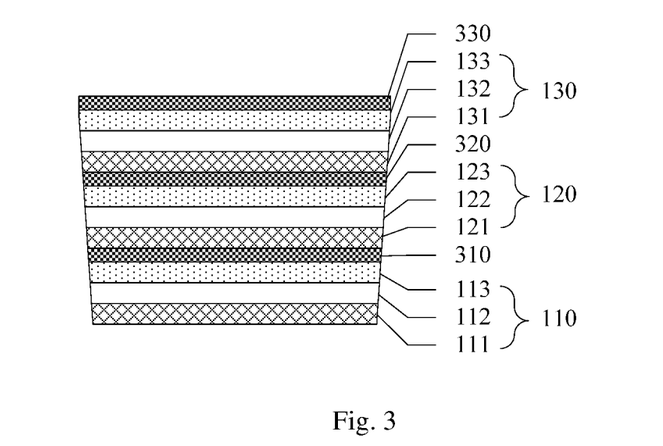
FIG. 3 is a layer schematic diagram of light emitting units in a pixel unit provided by an embodiment of the present disclosure.

FIG. 3 is a schematic diagram of a light emitting unit in a pixel unit provided by an embodiment of the present disclosure. In order to make the description more apparently, FIG. 3 only illustrates a layer structure of a light emitting unit. In the structure illustrated by FIG. 3, in addition to a light emitting layer and electrode layers, the structure further includes a thin film packaging layer disposed at a side of each of the light emitting unit away from the substrate. For example, the first light emitting unit 110 and the second light emitting unit 120 are provided with a first thin film packaging layer 310 therebetween, the second light emitting unit 120 and the third light emitting unit 130 are provided with a second thin film packaging layer 320 therebetween, and a side of the third light emitting unit 130 away from the second light emitting unit 120 is provided with a third thin film packaging layer 330, the present embodiment is not limited thereto. The thin film packaging layers 310, 320, and 330 can separate the light emitting units, and play an insulation effect between the light emitting units. It is to be noted that, the materials of the thin film packaging layers 310, 320, 330, and 330 are transparent insulating materials, so that the light emitted from the light emitting units can exit well.

Second Embodiment

At least one embodiment of the present disclosure provides a manufacturing method of an array substrate, which includes a plurality of pixel units arranged in an array on the substrate, forming each of the pixel units includes: forming a plurality of thin film transistors on the substrate; forming a plurality of light emitting units on the plurality of thin film transistors, the plurality of light emitting units are sequentially arranged along a direction perpendicular to a plane where the substrate is located, and each of the light emitting units is connected with one of the thin film transistors, and different ones of the light emitting units are connected to different ones of the thin film transistors. For example, the substrate can be a silicon substrate, the present embodiment is not limited thereto. The manufacturing method of the array substrate can be adopted to not only achieve an effect of realizing full color without a color filter and being switchable between a monochrome display device and a full color display device, but also improve the PPI.

For example, the manufacturing method of the array substrate provided by the present embodiment further includes: after forming the plurality of thin film transistors, forming a barrier wall to define a region for forming the light emitting units, forming the plurality of light emitting units on the plurality of thin film transistors includes: forming at least one layer in at least one of the light emitting units by an evaporation method using the barrier wall as an evaporation mask plate.

The present embodiment uses the barrier wall as an evaporation mask plate to pattern at least one of the light emitting units, which saves a high-precision FMM and a color filter which are needed to manufacture an organic light emitting diode, and can improve the PPI of the organic light emitting diode display device. Besides, the barrier wall surrounding each of the pixel units can reduce the pressure on the pixel units caused by the vacuuming process during the packaging process, so as to reduce the probability of damaging the pixels.

For example, the barrier wall can serve as a mask plate to pattern and form a light emitting unit of a micro organic light emitting diode display device, or pattern and form a light emitting unit of an ordinary organic light emitting diode display device.

Figure 4:
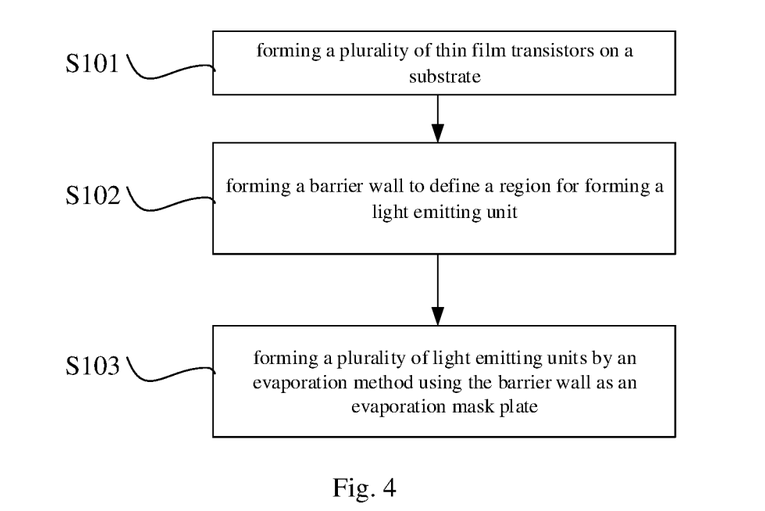
FIG. 4 is a schematic flow diagram of a manufacturing method of each of the pixel units in an array substrate provided by an embodiment of the present disclosure.

For example, as illustrated by FIG. 4, forming each of the pixel units includes the following steps.

S101: forming a plurality of thin film transistors on a substrate;

S102: forming a barrier wall to define a region for forming a light emitting unit;

S103: forming a plurality of light emitting units by an evaporation method using the barrier wall as an evaporation mask plate.

In an example, forming each of the pixel units specifically includes the following steps.

First step, forming three thin film transistors arranged in parallel in a region with a size of an ordinary sub pixel on a substrate; because a semiconductor technology can be adopted to prepare in an array substrate, the fining thin film transistors can be easily manufactured.

Second step, forming a barrier wall around the three thin film transistors arranged in parallel to define a region for forming a light emitting unit.

Third step, evaporating a first light emitting unit in a region defined and surrounded by the barrier wall, i.e., using the barrier wall as a mask plate to pattern and form the first light emitting unit, a size and shape of the first light emitting unit can be completely the same as the region defined and surrounded by the barrier wall.

For example, a thickness of the barrier wall gradually decreases along a direction from a position close to the substrate to a position away from the substrate. The thickness of the barrier wall refers to a width of a cross-section of the barrier wall. For example, the cross-section of the barrier wall has a trapezoid shape, and the present embodiment is not limited thereto, the cross-section can also have a triangle or stair shape. So that, in a region defined and surrounded by the barrier wall, the sizes of the plurality of light emitting units along a direction from the position close to the substrate to the position away from the substrate are not completely the same, for example, successively increasing.

For example, the material of the barrier wall can be photoresist or other organic materials, and the present embodiment is not limited thereto.

For example, evaporating the first light emitting unit includes: evaporating a first electrode, a light emitting layer, and a second electrode of a first light emitting unit, and the present embodiment is not limited thereto. Evaporating the first light emitting unit can further includes evaporating other function layers, such as a hole injection layer, a hole transport layer, a hole block layer, an electron injection layer, an electron transport layer and an electron block layer.

For example, the first electrode is an anode, the second electrode is a cathode, and the anode is electrically connected with a drain electrode of a thin film transistor located in the middle of the three thin film transistors.

For example, the material of the first electrode and the second electrode includes a conductive material. For example, except the electrode of the first light emitting unit closest to the substrate, the other electrodes are made of a transparent conductive material, so that the light emitted from the light emitting units can exit well. It is to be noted that, the material of the electrode of the first light emitting unit closest to the substrate can be a transparent conductive material, or a non-transparent conductive material. For example, the material of the first electrode and the second electrode can include a metal oxide material or a metal material. For example, the metal oxide material includes indium tin oxide, indium-doped zinc oxide, and so on. For example, the thickness of the metal oxide material is 300-500 nm, and the present embodiment is not limited thereto. For example, the metal material includes silver, aluminum and so on. For example, the thickness of the metal material is 10-20 nm, and the present embodiment is not limited thereto, as long as the thickness is thin enough to make the metal material transparent.

For example, at least one of the thin film transistors is formed between the barrier wall and the substrate, the manufacturing method includes:

Fourth step, forming a via hole in the barrier wall, and connecting at least one of the light emitting units with a corresponding one of the thin film transistors through the via hole. For example, using a method of using laser to puncture the barrier wall located on the thin film transistors, i.e., puncturing the barrier wall located on any one of the thin film transistors located at two sides of the three thin film transistors; evaporating a first electrode of the second light emitting unit, the first electrode can be electrically connected with a drain electrode of the thin film transistor through the manufactured via hole. Then, taking the barrier wall as a mask plate to pattern and form the subsequent films of the second light emitting unit. The present embodiment is not limited thereto, and an etching method can be adopted to form the via hole.

Fifth step, using a method of using laser to puncture the barrier wall located on the other thin film transistor located at two sides of the three thin film transistors; and evaporating a first electrode of the third light emitting unit, the first electrode can be electrically connected with a drain electrode of the thin film transistor through the manufactured via hole. Then, taking the barrier wall as a mask plate to pattern and form the subsequent films of the third light emitting unit.

For example, forming a thin film packaging layer at a side of each of the light emitting units away from the substrate. The thin film packaging layer can be used to separate the light emitting units and play an insulation effect between the light emitting units. It is to be noted that, the material of the thin film packaging layer can be a transparent insulating material, so that the light emitted from the light emitting units can exit well.

It is to be noted that, the abovementioned steps are exemplary steps, and the present embodiment is not limited thereto.

Third Embodiment

At least one embodiment of the present disclosure provides a manufacturing method of an array substrate, and the manufacturing method of the light emitting unit closest to the thin film transistors is different from the manufacturing method provided by the second embodiment.

Figure 5:
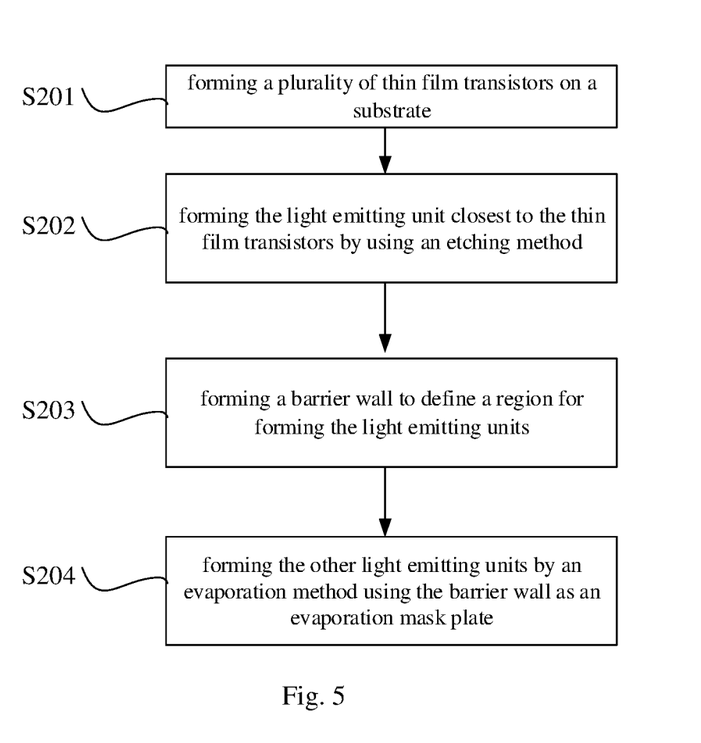
FIG. 5 is a schematic flow diagram of a manufacturing method of each of the pixel units in an array substrate provided by another embodiment of the present disclosure.

For example, as illustrated by FIG. 5, forming each of the pixel units includes the following steps.

S201: forming a plurality of thin film transistors on a substrate;

S202: forming the light emitting unit closest to the thin film transistors by using an etching method;

S203: forming a barrier wall to define a region for forming the light emitting units;

S204: forming the other light emitting units by an evaporation method using the barrier wall as an evaporation mask plate.

In an example, forming each of the pixel units specifically includes the following steps.

First step, forming three thin film transistors arranged in parallel in a region with a size of an ordinary sub pixel on the substrate; because a semiconductor technology can be adopted to prepare in an array substrate, the fining thin film transistors can be easily manufactured.

Second step, using an etching method to form the first light emitting unit closest to the thin film transistors, the first light emitting unit formed by using an etching method includes a first electrode, a light emitting layer, and a second electrode of the first light emitting unit, and the present embodiment is not limited thereto. The first electrode is electrically connected with a drain electrode of a thin film transistor located in the middle of the three thin film transistors. Herein, "using an etching method to form" refers to that the patterning processes of the layers in the light emitting unit are implemented by etching processes. For example, the forming steps of the light emitting layer include: firstly depositing a light emitting material layer, then using a mask to etch the light emitting material layer to form the light emitting layer.

For example, because using the etching method to form the other light emitting units in a direction of the first light emitting unit away from the substrate will affect the first light emitting unit, thus, it is needed to dispose a barrier wall to evaporate the subsequent light emitting units, and using the barrier wall as a mask plate to pattern and form the other light emitting units. It is to be noted that, the shape and size of the first light emitting unit and the shape and size of the light emitting region defined by the subsequently formed barrier wall are not required to be completely the same, the shape and size of the first light emitting unit can be relatively smaller or larger than the shape and size of the light emitting region defined by the subsequently formed barrier wall. Upon the size of the first light emitting unit being larger than that of the light emitting region defined by the subsequently formed barrier wall, the projections of the first light emitting unit on the substrate does not overlap with the projections of the via holes formed in the barrier wall on the substrate.

Third step, forming a barrier wall around the three thin film transistors arranged in parallel to define a region for forming the light emitting units.

The subsequent steps of forming the other light emitting units are the same as the second embodiment, and the repeated portions are omitted herein.

It is to be noted that, the abovementioned steps are exemplary steps, and the present embodiment is not limited thereto.

Fourth Embodiment

At least one embodiment of the present disclosure provides a display device, the display device includes any one of the abovementioned array substrate, can be switchable between a monochrome display device and a full color display device, and can improve the PPI.

For example, the display device includes an organic light emitting diode display device, a micro organic light emitting diode display device and so on. The present embodiment is not limited thereto.

For example, the display device can be applied to a helmet display device, a stereo display glasses, a glasses type display device, and the like.

The following statements should be noted:

(1) Unless otherwise defined, the same reference numerals in at least one embodiment and the drawings of the present disclosure represent the same meaning.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

The foregoing is only the embodiments of the present invention and not intended to limit the scope of protection of the present invention. Any changes or substitutions easily occur to those skilled in the art within the technical scope of the present disclosure should be covered in the protection scope of the present disclosure. Therefore, the protection scope of the present disclosure should be based on the protection scope of the claims.

The present application claims priority of China Patent application No. 201610994873.8 filed on Nov. 11, 2016, the content of which is incorporated in its entirety as portion of the present application by reference herein.

What is claimed is:

1. An array substrate, comprising:
a substrate; and
a plurality of pixel units arranged in an array on the substrate,
wherein each of the pixel units is provided with a plurality of thin film transistors, each of the pixel units comprises a plurality of light emitting units, the plurality of light emitting units are sequentially arranged along a direction perpendicular to a plane where the substrate is located, and disposed at a side of the thin film transistors away from the substrate, each of the light emitting units is connected with one of the thin film transistors, and different ones of the light emitting units are connected to different ones of the thin film transistors to control different light emitting units independently; and
wherein different light emitting units are insulated from each other, and different thin film transistors are insulated from each other;
each of the light emitting units comprises a first electrode, a light-emitting layer and a second electrode; and
the different light emitting units do not share adjacent first electrodes or adjacent second electrodes of corresponding different light emitting units.

2. The array substrate according to claim 1, further comprising:
a barrier wall surrounding each of the pixel units to define a region for forming the light emitting units.

3. The array substrate according to claim 2, wherein a thickness of the barrier wall gradually decreases along a direction from a position close to the substrate to a position away from the substrate.

4. The array substrate according to claim 2, wherein at least one of the thin film transistors is formed between the barrier wall and the substrate, and at least one of the light emitting units is connected with a corresponding one of the thin film transistors through a via hole disposed in the barrier wall.

5. The array substrate according to claim 1, further comprising:
a thin film packaging layer, disposed at a side of each of the light emitting units away from the substrate.

6. The array substrate according to claim 1, wherein, and the first electrode is connected with a corresponding one of the thin film transistors.

7. An array substrate, comprising:
a substrate; and
a plurality of pixel units arranged in an array on the substrate,
wherein each of the pixel units is provided with a plurality of thin film transistors, each of the pixel units comprises a plurality of light emitting units, the plurality of light emitting units are sequentially arranged along a direction perpendicular to a plane where the substrate is located, and disposed at a side of the thin film transistors away from the substrate, each of the light emitting units is connected with one of the thin film transistors, and different ones of the light emitting units are connected to different ones of the thin film transistors, wherein each of the pixel units comprises three thin film transistors and three light emitting units, and the three light emitting units respectively emit red light, green light, and blue light; and
wherein the three light emitting units are insulated from each other, and different thin film transistors are insulated from each other;
each of the three light emitting units comprises a first electrode, a light-emitting layer, and a second electrode; and
the three light emitting units do not share adjacent first electrodes or adjacent second electrodes of corresponding different light emitting units.

8. The array substrate according to claim 1, wherein a maximum size of each of the plurality of light emitting units along a direction parallel to the plane where the substrate is located is less than 10 μm.

9. A manufacturing method of an array substrate, comprising:
forming a plurality of pixel units arranged in an array on a substrate;
forming each of the pixel units comprises:
forming a plurality of thin film transistors on the substrate; and
forming a plurality of light emitting units on the plurality of thin film transistors, the plurality of light emitting units are sequentially arranged along a direction perpendicular to a plane where the substrate is located,
wherein each of the light emitting units is connected with one of the thin film transistors, and different ones of the light emitting units are connected to different ones of the thin film transistors to control different light emitting units independently;
wherein different light emitting units are insulated from each other, and different thin film transistors are insulated from each other;
each of the light emitting units comprises a first electrode, a light-emitting layer and a second electrode; and
different light emitting units do not share adjacent first electrodes or adjacent second electrodes of corresponding different light emitting units.

10. The manufacturing method of the array substrate according to claim 9, further comprising:
after forming the plurality of thin film transistors, forming a barrier wall to define a region for forming the light emitting units,
wherein forming the plurality of light emitting units on the plurality of thin film transistors comprises:
forming at least one layer in at least one of the light emitting units by an evaporation method using the barrier wall as an evaporation mask plate.

11. The manufacturing method of the array substrate according to claim 9, wherein one of the light emitting units closest to the thin film transistors is formed through an etching method.

12. The manufacturing method of the array substrate according to claim 10, wherein at least one of the thin film transistors is formed between the barrier wall and the substrate, and the manufacturing method further comprises:
forming a via hole in the barrier wall, and connecting at least one of the light emitting units with a corresponding one of the thin film transistors through the via hole.

13. The manufacturing method of the array substrate according to claim 9, further comprising:
forming a thin film packaging layer at a side of each of the light emitting units away from the substrate.

14. A display device, comprising the array substrate according to claim 1.

15. The array substrate according to claim 3, wherein at least one of the thin film transistors is formed between the barrier wall and the substrate, and at least one of the light emitting units is connected with a corresponding one of the thin film transistors through a via hole disposed in the barrier wall.

16. The manufacturing method of the array substrate according to claim 10, wherein one of the light emitting units closest to the thin film transistors is formed through an etching method.

17. The array substrate according to claim 15, wherein the plurality of thin film transistor comprise a first thin film transistor, a second thin film transistor, and a third thin film transistor, the plurality of the light emitting units comprise a first light emitting unit, a second light emitting unit, and a third light emitting unit, and the via hole comprises a first via hole and a second via hole respectively in facing portions of the barrier wall, the first electrode of the first light emitting unit being directly connected with the second thin film transistor, the first electrode of the second light emitting unit being connected with the third thin film transistor through the first via hole in the barrier wall, and the first electrode of the third light emitting unit is connected with the first thin film transistor through the second via hole in the barrier wall.

* * * * *